United States Patent
Buck

(10) Patent No.: US 6,376,913 B1
(45) Date of Patent: Apr. 23, 2002

(54) INTEGRATED SEMICONDUCTOR CHIP HAVING LEADS TO ONE OR MORE EXTERNAL TERMINALS

(75) Inventor: Martin Buck, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/374,895

(22) Filed: Aug. 13, 1999

(30) Foreign Application Priority Data

Aug. 13, 1998 (DE) .......................................... 198 36 753

(51) Int. Cl.[7] .......................... H01L 27/06; H01L 27/08; H01L 23/50; H01L 23/28; H01L 23/12
(52) U.S. Cl. ...................... 257/775; 257/666; 257/696; 257/698; 257/673; 257/783; 257/691; 257/692; 438/14; 438/118; 438/482
(58) Field of Search .......................... 257/666, 669–674, 257/676, 696, 698, 691–693, 783, 775; 438/14, 131, 118, 127, 689, 682

(56) References Cited

U.S. PATENT DOCUMENTS

| | | | | |
|---|---|---|---|---|
| 5,185,652 A | * | 2/1993 | Waldron et al. | 257/758 |
| 5,648,682 A | * | 7/1997 | Warner et al. | 257/775 |
| 5,844,779 A | * | 12/1998 | Carichner | 257/691 |
| 5,859,479 A | * | 1/1999 | Onodia | 257/775 |
| 6,008,532 A | * | 12/1999 | Choi | 257/692 |
| 6,081,035 A | * | 6/2000 | Nakazawa et al. | 257/673 |
| 6,117,694 A | * | 9/2000 | Smith et al. | 438/14 |

FOREIGN PATENT DOCUMENTS

| | | | | |
|---|---|---|---|---|
| JP | 58-191453 | * | 11/1983 | 257/775 |
| JP | 02 224370 | * | 9/1990 | 257/775 |
| JP | 4-216657 | | 8/1992 | |
| JP | 5-129534 | | 5/1993 | |
| JP | 7-45779 | | 2/1995 | |
| JP | 8-88313 | | 4/1996 | |
| JP | 8-330354 | | 12/1996 | |

* cited by examiner

Primary Examiner—Alexander O. Williams
(74) Attorney, Agent, or Firm—Laurence A. Greenberg; Werner H. Stemer; Ralph E. Locher

(57) ABSTRACT

On the leads of an integrated semiconductor chip which establish a connection to external terminals of a supply voltage, highly clocked current pulses may result in the excitation of potential fluctuations through to resonance oscillations at an internal terminal of the respective lead. In order to attenuate these potential fluctuations, a resistance is prescribed for one or more leads, which resistance is large enough to attenuate the potential fluctuations but is small enough to cause only a predetermined maximum permissible voltage drop on the respective lead. The respective resistance can be obtained by using a material having a corresponding resistivity or by reducing the conductor cross section with a notch along the lead.

8 Claims, 1 Drawing Sheet

INTEGRATED SEMICONDUCTOR CHIP HAVING LEADS TO ONE OR MORE EXTERNAL TERMINALS

BACKGROUND OF THE INVENTION

FIELD OF THE INVENTION

The present invention relates to an integrated semiconductor chip having one or more leads to be connected to one or more external terminals of a supply voltage.

A semiconductor module whose housing contains a silicon chip having on-chip terminals to one or more integrated circuits situated on the silicon chip is usually provided with leads from one or more of such internal terminals to one or more terminals which are situated outside the chip area. Such terminals may be, for example, terminals for external voltage supplies or connections to other assemblies that are situated for example on a circuit board outside the module. In many embodiments, the leads are bent at a right angle at the locations at which they are contact-connected to the external terminals (for example contacts on the circuit board). In order to minimize the power loss in the leads of the chip, the leads are generally configured to have the lowest possible impedance.

Ever higher data rates for integrated semiconductor chips are the cause of ever higher clock rates at which the chip is operated. During each clock cycle, a certain amount of energy is consumed on the chip, this causing current pulses on the leads of the voltage supply, which become correspondingly faster and steeper at higher clock rates. The leads from the integrated circuits of a chip to the external supply potentials of a supply voltage have lead inductances that, together with capacitances on the chip, form an oscillatory system. As a result of faster and steeper current pulses on the leads, the voltage drop across the inductances and capacitances also rises, oscillations thereby being excited which can ultimately result in undesirable resonance oscillations. Thus, the associated influence on the internal voltage supply can no longer be disregarded. Steep current pulses can consequently result in the excitation of potential fluctuations, which oscillate periodically and can ultimately result in resonances at the internal terminals of the respective lead of the chip, and they can impair the functioning of the chip. Since different functional groups of the chip, such as logic circuits or output drivers, are connected to the supply voltage, potential fluctuations at the internal supply voltage of one functional group can also influence the voltage supply of the respective other functional groups. Depending on the sensitivity of the respective circuits toward irregularities in the supply voltage, the functioning of the chip may be jeopardized in this case.

Attempts have previously been made to configure semiconductor chips such that potential fluctuations at the internal voltage supply do not influence the operation of the semiconductor chip. Therefore, the switching speed of a chip is only allowed to reach a level where voltage fluctuations that are still just acceptable are caused. However, this results in losses in the data transmission speed of a chip. In order to adapt the maximum permissible data transmission rate of the semiconductor chip optimally to an application, it is necessary, accordingly, to specify the ambient conditions of the chip (for example capacitances, inductances), depending on the application. This is scarcely possible, however, on account of the large number of influencing variables in a digital circuit. Moreover, such a measure has the effect of restriction to a defined area of application of the semiconductor chip. Another possibility is to attenuate potential fluctuations at an internal terminal of a lead by providing an attenuation resistor having a defined resistance on the chip. Such a resistor does not undertake any further tasks apart from this in an integrated circuit. Consequently, additional valuable area on the chip is necessary in order to accommodate such a resistor.

SUMMARY OF THE INVENTION

It is accordingly an object of the invention to provide an integrated semiconductor chip having leads to one or more external terminals which overcomes the above-mentioned disadvantages of the prior art devices of this general type, which attenuates potential fluctuations at an internal terminal of a lead of an integrated semiconductor chip, the fluctuations being excited by current pulses on the lead, in such a way that the internal voltage supply is stabilized even at high clock rates and the functioning of the chip remains ensured, without an additionally necessary chip area intended for this purpose being required.

With the foregoing and other objects in view there is provided, in accordance with the invention, an integrated semiconductor chip, including an internal terminal and a lead having a first end connected to the internal terminal, a second end to be connected to an external terminal of a supply voltage, and a given total length, the lead further having a resistance large enough for it to sufficiently attenuate potential fluctuations at the internal terminal, the potential fluctuations being excited by current pulses on the lead, but the resistance being small enough to cause only a predetermined maximum permissible voltage drop for a maximum current on the lead, the lead also having a cross section reduced within a delimited section effecting the resistance by virtue of the fact that the cross section of the lead is reduced within the delimited section and the delimited section having a length being small relative to the given total length of the lead.

In accordance with an added feature of the invention, the cross section reduced within the delimited section is a notch formed in the lead.

In accordance with another feature of the invention, a size ratio between the length of the delimited section having the notch and the given total length of the lead is 1:1000.

In accordance with a concomitant feature of the invention, the notch in the lead is effected by one of etching and by cutting the lead with a laser.

Other features which are considered as characteristic for the invention are set forth in the appended claims.

Although the invention is illustrated and described herein as embodied in an integrated semiconductor chip having leads to one or more external terminals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
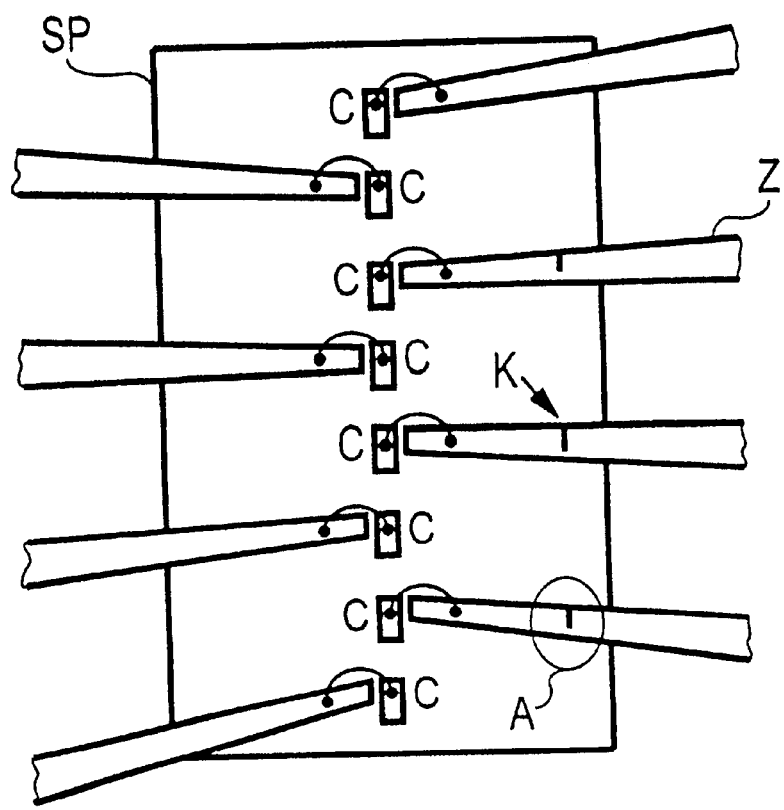
FIG. 1 is a diagrammatic, plan view of a part of a semiconductor module with leads from internal terminals of a silicon chip to terminals outside a chip according to the invention.

In all the figures of the drawing, sub-features and integral parts that correspond to one another bear the same reference symbol in each case. Referring now to the figures of the drawing in detail and first, particularly, to FIG. 1 thereof, there is shown a diagrammatic illustration of part of a semiconductor module with leads Z from internal terminals C of a silicon chip SP to terminals outside the chip SP, which are routed out as so-called leads Z. So-called bonding wires are used to establish electrical contact between the internal terminals C (bonding pads) of the silicon chip SP and the leads Z. A cross section of the lead Z is not identical over its entire length. The cross section at one end of the lead Z is usually wider than the cross section at the other end. The cross section changes uniformly between the two ends. The narrower end is usually situated at the internal terminal C, whereas the wider end is situated at an external terminal of a semiconductor chip.

As mentioned in the introduction, leads and thus bonding wires as well have previously been configured to have the lowest possible impedance, in order to produce as little power loss as possible in the conductor. Instead of this, one or more leads Z are now configured such that they have a predetermined resistance. A value RD of the resistance is large enough sufficiently to attenuate potential fluctuations at the internal terminal C of the respective lead Z, which fluctuations are excited by current pulses on the respective leads Z and oscillate periodically and can ultimately result in resonance oscillations. However, the value RD is small enough to cause only a predetermined maximum permissible voltage drop for a maximum current on the respective lead Z.

Figure 2:
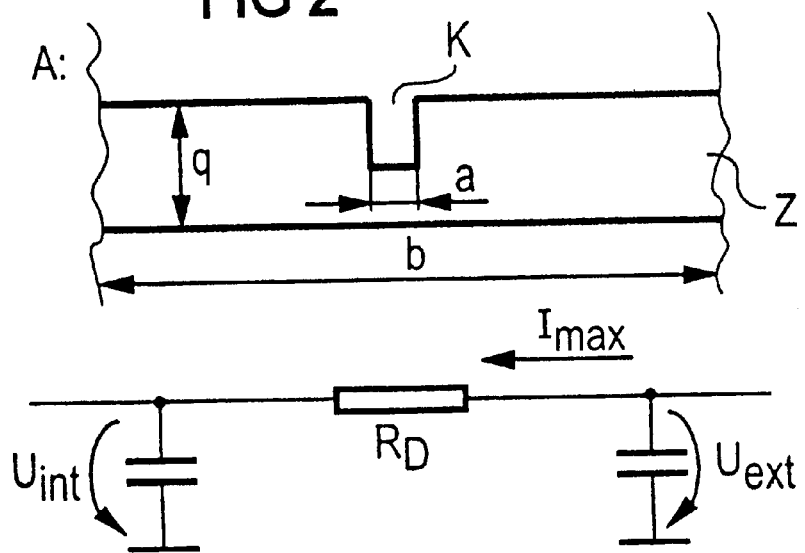
FIG. 2 is a diagrammatic, fragmentary, cross-sectional view of a lead with a reduction in a conductor cross section (notch) and an equivalent circuit diagram for a lead resistance.

FIG. 2 diagrammatically shows the cross section q of a section of the lead Z of the integrated semiconductor chip. The cross section q may be regarded as virtually constant over a distance of a portion b, the distance being short in relation to a total length of the lead Z. The lead Z has a predetermined attenuation resistance, which is expressed by the lead resistance RD in the equivalent circuit diagram illustrated. The maximum permissible value of such a resistance RD may be dimensioned as follows:

$$R_{D\max} = \frac{U_{ext}}{I_{max}} \cdot \frac{\alpha}{100\%}$$

where $R_{Dmax}$=a maximum permissible attenuation resistance, $I_{max}$=a maximum current occurring through a pin of the semiconductor chip, $U_{ext}$=an externally applied supply voltage, and $\alpha$=a percentage of the maximum permissible potential fluctuation of the internal supply voltage.

The resistance RD thus defined is obtained in the exemplary embodiment shown by virtue of the fact that the conductor cross section q of the lead Z is reduced within a delimited section a along the lead Z (notch K). Reducing the conductor cross section q at an arbitrary point correspondingly increases the resistance of the lead Z.

The inductance of a conductor is concomitantly determined by the form of the conductor cross section. Thus, the inductance of strip-type conductors, that is to say of conductors that are very flat and comparatively wide, is comparatively low. Due to the reasons mentioned in the introduction, it is desirable to keep the inductance of the leads Z as small as possible, which is why the leads Z are usually configured to be as wide as possible. For this reason, it is advantageous that the notch K (therefore, the lead Z becomes narrower at this point) is effected over a short section a in relation to the total length of the lead Z and, as a result, the inductance is not appreciably increased. A size ratio between the length of the section a with the notch K and the total length of the lead Z may be 1:1000, for example.

As a technical apparatus for reducing a conductor cross section, it is possible to use a laser that cuts the corresponding notch K into the respective lead Z. As an alternative, the respective notch K can also be produced by etching. The two methods need not be introduced anew for this purpose into a production process, since they are already used in a similar manner in various other process steps for producing the semiconductor chip (for example burning fuses into memory cell arrays via laser light, etching different layer planes or the lead frame).

In another embodiment, the defined resistance RD of the lead Z may be produced by using a material having a corresponding resistivity during the production of the respective lead Z, without the conductor cross section q in this case being changed in the portion b shown.

In both embodiments, valuable chip area is not required for attenuating potential fluctuations at the internal terminal C of the lead Z, since resistors which are disposed on the chip area and fulfill the same function are not required.

I claim:

1. An integrated semiconductor chip, comprising:

a plurality of internal terminals; and a plurality of leads each having a first end connected to one of said plurality of internal terminals, a second end to be connected to an external terminal of a supply voltage, and a given total length, at least one respective lead of said plurality of leads has a resistance large enough for it to sufficiently attenuate potential fluctuations at said plurality of internal terminals, the potential fluctuations being excited by current pulses on said respective lead, but said resistance being small enough to cause only a predetermined maximum permissible voltage drop for a maximum current on said respective lead, said respective lead having a cross section reduced within a delimited section effecting said resistance by virtue of the fact that said cross section of said respective lead is reduced within said delimited section and said delimited section having a length being small relative to said given total length of said respective lead.

2. The integrated semiconductor chip according to claim 1, wherein said cross section reduced within said delimited section is a notch formed in said respective lead.

3. The integrated semiconductor chip according to claim 2, wherein a size ratio between said length of said delimited section having said notch and said given total length of said respective lead is 1:1000.

4. The integrated semiconductor chip according to claim 2, wherein said notch in said respective lead is effected by one of etching and by cutting said respective lead with a laser.

5. An integrated semiconductor chip, comprising:

an internal terminal; and a lead having a first end connected to said internal terminal, a second end to be connected to an external terminal of a supply voltage, and a given total length, said lead further having a resistance large enough for it to sufficiently attenuate potential fluctuations at said internal terminal, the potential fluctuations being excited by current pulses on said lead, but said resistance being small enough to cause only a predetermined maximum permissible voltage drop for a maximum current on said lead, said lead also having a cross section reduced within a delimited section effecting said resistance by virtue of the fact that said cross section of said lead is reduced within said delimited section and said delimited section having a length being small relative to said given total length of said lead.

6. The integrated semiconductor chip according to claim 5, wherein said cross section reduced within said delimited section is a notch formed in said lead.

7. The integrated semiconductor chip according to claim 6, wherein a size ratio between said length of said delimited section having said notch and said given total length of said lead is 1:1000.

8. The integrated semiconductor chip according to claim 6, wherein said notch in said lead is effected by one of etching and by cutting said lead with a laser.

* * * * *